(12) United States Patent
Sakai

(10) Patent No.: US 6,642,624 B2
(45) Date of Patent: Nov. 4, 2003

(54) BALL GRID ARRAY TYPE SEMICONDUCTOR DEVICE

(75) Inventor: Hiroshi Sakai, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/576,175

(22) Filed: May 23, 2000

(65) Prior Publication Data

US 2003/0025204 A1 Feb. 6, 2003

(30) Foreign Application Priority Data

May 31, 1999 (JP) ............................ 11-153056

(51) Int. Cl.[7] .................. H01L 23/48; H01L 23/52; H01L 29/40
(52) U.S. Cl. ............... 257/774; 257/702; 257/778; 257/779; 257/780; 257/737; 257/738; 257/773
(58) Field of Search ................. 257/779, 780, 257/773, 774, 738; 174/263–266

(56) References Cited

U.S. PATENT DOCUMENTS 5,355,283 A * 10/1994 Marrs et al. ............... 361/760
5,489,750 A * 2/1996 Sakemi et al. ............. 174/261
5,796,589 A * 8/1998 Barrow ....................... 361/774
5,936,848 A * 8/1999 Mehr et al. ................. 361/777
5,962,922 A * 10/1999 Wang .......................... 257/773

FOREIGN PATENT DOCUMENTS

| JP | 63283147 A | 11/1988 |
| JP | 05-129370 | 5/1993 |
| JP | 08-153750 | 6/1996 |
| JP | 2735059 | 1/1998 |
| JP | 10-98261 | 4/1998 |
| JP | 10-107073 | 4/1998 |
| JP | 11-26929 | 1/1999 |

* cited by examiner

Primary Examiner—Tom Thomas
Assistant Examiner—Nitin Parekh
(74) Attorney, Agent, or Firm—Sughrue Mion, PLLC

(57) ABSTRACT

In a ball grid array type semiconductor device including an interposer substrate having first and second surfaces, a semiconductor chip mounted on the first surface of the interposer substrate, and solder balls formed on the second surface of the interposer substrate, a plurality of through holes are formed within the interposer substrate, and each of the solder balls clogs one of the through holes of the interposer substrate.

2 Claims, 5 Drawing Sheets

BALL GRID ARRAY TYPE SEMICONDUCTOR DEVICE

BACKGROUND OF THE INVENTION

1. Field of the Invention

The present invention relates to a ball grid array (BGA) type semiconductor device and its manufacturing method. Particularly, it relates to the improvement of a repairing method of defective solder generated when the BGA type semiconductor device is mounted on a motherboard.

2. Description of the Related Art

Since BGA type semiconductor devices (packages) can have a larger number of external terminal pins as compared with quad flat packages (QFPs) and small outline packages (SOPs), such BGA type packages have recently been developed.

In a prior art method for manufacturing a BGA type semiconductor device, a semiconductor chip is mounted on a first surface of an interposer substrate. On the other hand, solder balls are provided on a second surface of the interposer substrate. As a result, the semiconductor chip is electrically connected via through holes having a relatively small diameter provided in the interposer substrate to the solder balls. Next, the BGA semiconductor device is mounted on a motherboard by soldering the solder balls thereto. This will be explained later in detail.

In the above-described method, an open state or a short-circuit state may be generated due to the defective soldering process. In order to repair the open state or the short-circuit state, the interposer substrate is separated and detached from the motherboard by a heating process using hot air blown via through holes provided within the motherboard (see JP-A-9-181404) or by a special local heating process using hot air blown via nozzles provided at the periphery of the BGA type semiconductor device (see JP-A-11-26929). Then, the surface of the motherboard is cleaned, and solder paste is again adhered thereto. Finally, a new BGA type semiconductor device is mounted on the motherboard. Note that BGA type semiconductor devices including such defective solder balls are usually discarded. Thus, the manufacturing cost is increased.

SUMMARY OF THE INVENTION

It is an object of the present invention to decrease the manufacturing cost of BGA type semiconductor devices.

According to the present invention, in a BGA type semiconductor device including an interposer substrate having first and second surfaces, a semiconductor chip mounted on the first surface of the interposer substrate, and solder balls formed on the second surface of the interposer substrate, a plurality of through holes are formed within the interposer substrate, and each of the solder balls clogs one of the through holes of the interposer substrate.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENTS

Before the description of the preferred embodiments, a prior art method for manufacturing a BGA type semiconductor device will be explained with reference to FIGS. 1A and 1B.

Figure 1A:
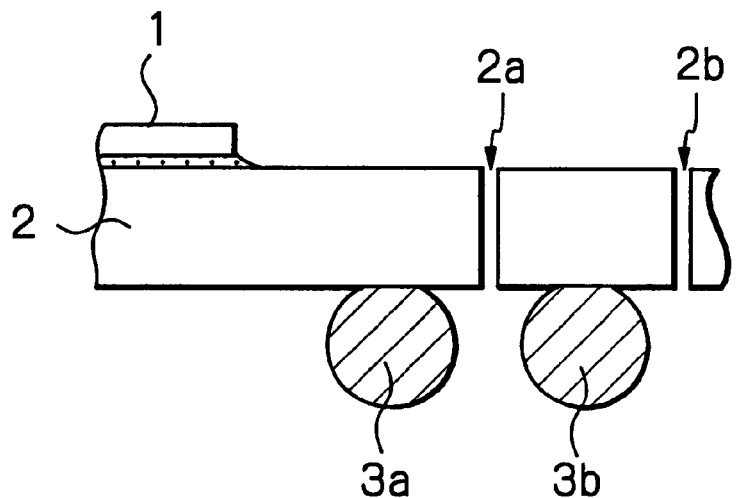
FIGS. 1A and 1B are cross-sectional views illustrating a prior art method for manufacturing a BGA type semiconductor device.

First, referring to FIG. 1A, a semiconductor chip 1 is mounted on a first surface of an interposer substrate 2. In this case, the semiconductor chip 1 can be of a flip-chip type. On the other hand, solder balls 3a and 3b are provided on a second surface of the interposer substrate 2. The semiconductor chip 1 is electrically connected via through holes 2a and 2b having a relatively small diameter such as 0.3 mm provided in the interposer substrate 2 to the solder balls 3a and 3b, respectively. Note that metal layers (not shown) are formed within the through holes 2a and 2b.

Figure 1B:
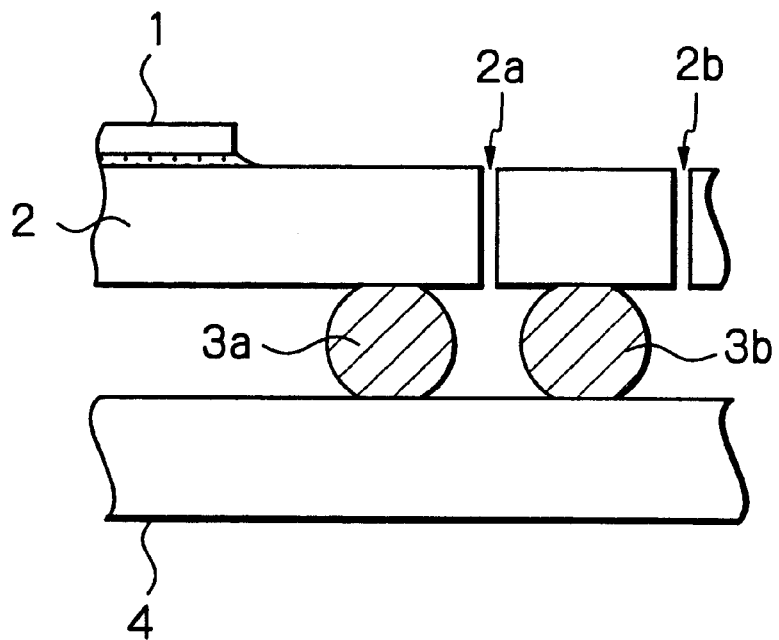

Next, referring to FIG. 1B, the BGA semiconductor device of FIG. 1A is mounted on a motherboard 4 by soldering the solder balls 3a and 3b thereto.

Figure 2A:
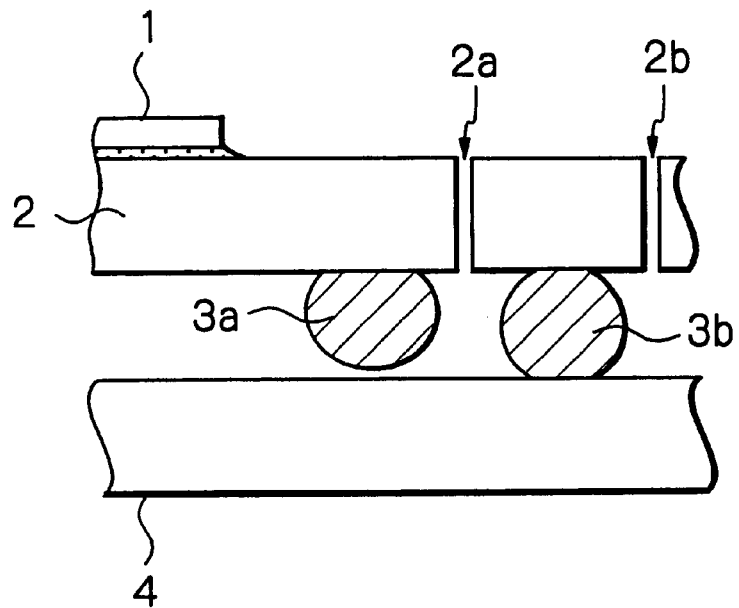
FIGS. 2A and 2B are cross-sectional views for explaining defective soldering states of the BGA type semiconductor device of FIG. 1B.

In the method as illustrated in FIGS. 1A and 1B, an open state or a short-circuit state may be generated due to the defective soldering process. For example, as illustrated in FIG. 2A, the solder ball 3a is disconnected from the motherboard 4, which shows an open state. On the other hand, as illustrated in FIG. 2B, the solder ball 3a is electrically connected to the solder ball 3b, which shows a short-circuit state.

Figure 2B:
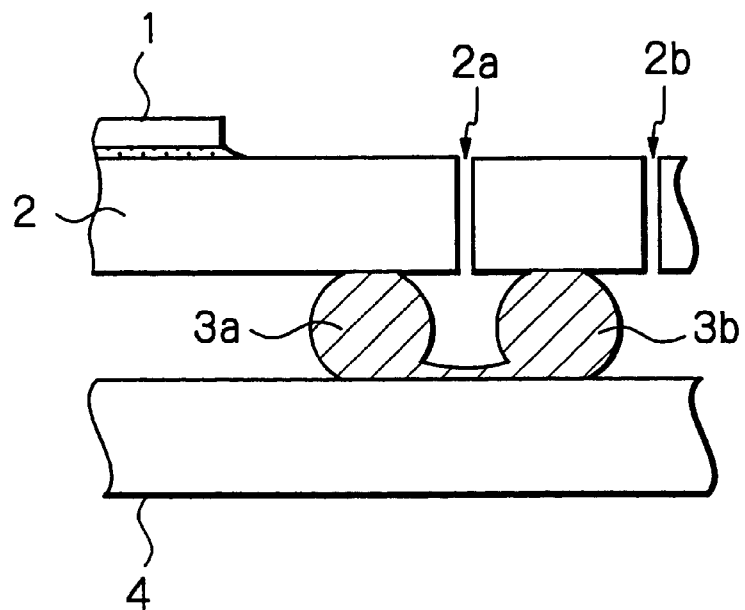

In order to repair the open state as illustrated in FIG. 2A or the short-circuit state as illustrated in FIG. 2B, in the prior art, the interposer substrate 2 is separated and detached from the motherboard 4 by a heating process using hot air blown via through holes provided within the motherboard 4 (see JP-A-9-181404) or by a special local heating process using hot air blown via nozzles provided at the periphery of the BGA type semiconductor device (see JP-A-11-26929). Then, the surface of the motherboard 4 is cleaned, and solder paste is again adhered thereto. Finally, a new BGA type semiconductor device is mounted on the motherboard 4. This would increase the manufacturing cost.

Note that BGA type semiconductor devices including such defective solder balls are usually discarded.

A first embodiment of the method for manufacturing a BGA type semiconductor device according to the present invention will be explained next with reference to FIGS. 3A and 3B.

Figure 3A:
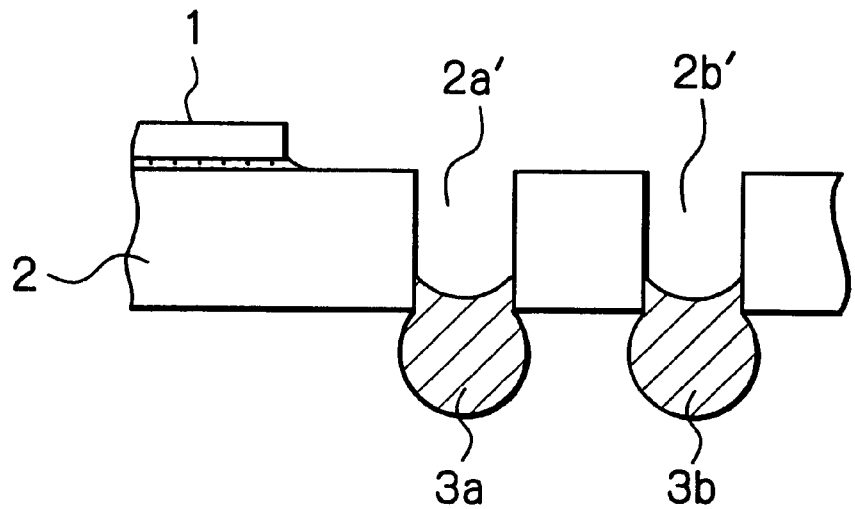
FIGS. 3A and 3B are cross-sectional views illustrating a first embodiment of the method for manufacturing a BGA type semiconductor device according to the present invention.

First, referring to FIG. 3A, a semiconductor chip 1 is mounted on a first surface of an interposer substrate 2. In this case, the semiconductor chip 1 can be of a flip-chip type. On the other hand, solder balls 3a and 3b are provided on a second surface of the interposer substrate 2. The semiconductor chip 1 is electrically connected via through holes 2a' and 2b' having a relatively large diameter such as 0.5 mm provided in the interposer substrate 2 to the solder balls 3a and 3b, respectively. In this case, the solder balls 3a and 3b are provided so as to clog the through holes 2a' and 2b', respectively. Also, metal layers (not shown) are formed within the through holes 2a' and 2b'.

Figure 3B:
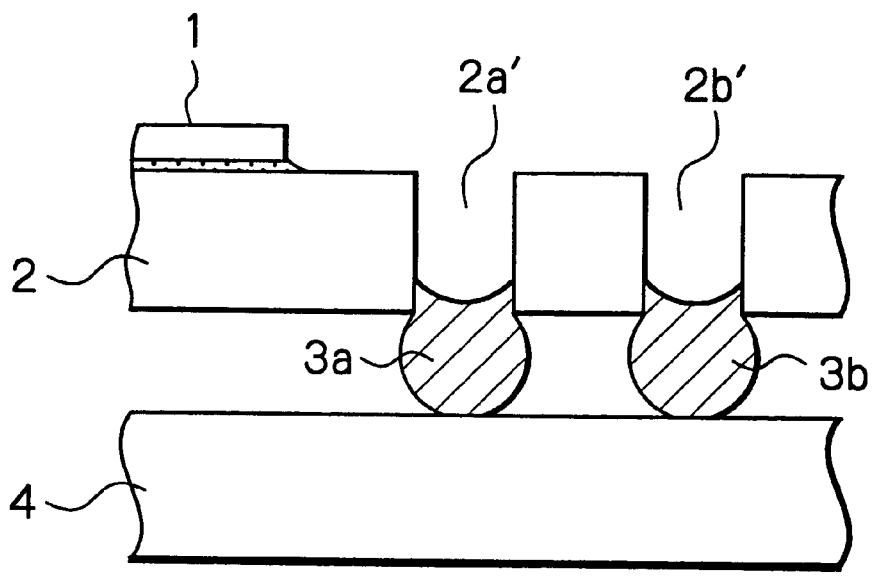

Next, referring to FIG. 3B, the BGA semiconductor device of FIG. 3A is mounted on a motherboard 4 by soldering the solder balls 3a and 3b thereto.

Figure 4A:
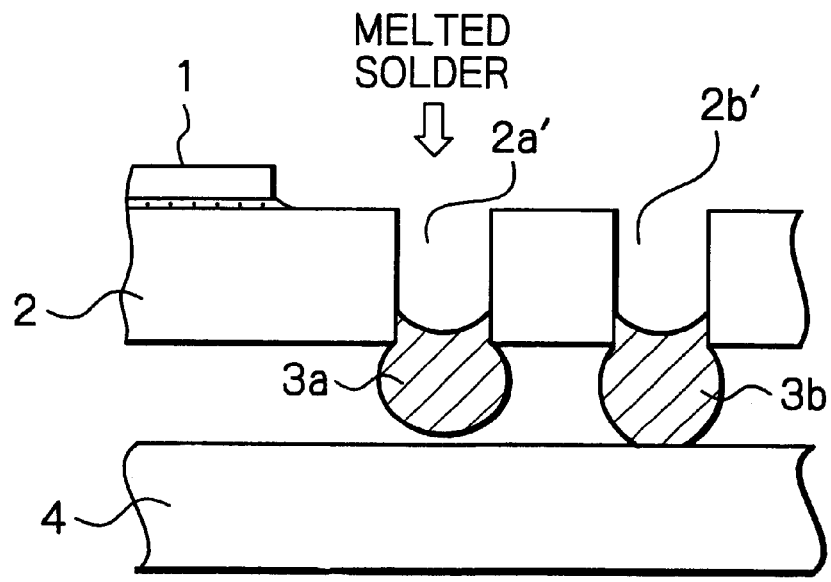
FIGS. 4A and 4B are cross-sectional views for explaining defective soldering states of the BGA type semiconductor device of FIG. 3B.

Even in the method as illustrated in FIGS. 3A and 3B, an open state or a short-circuit state may be generated due to the defective soldering process. For example, as illustrated in FIG. 4A, the solder ball 3a is disconnected from the motherboard 4, which shows an open state. On the other hand, as illustrated in FIG. 4B, the solder ball 3a is electrically connected to the solder ball 3b, which shows a short-circuit state.

In order to repair the open state solder ball 3a in FIG. 4A, melted solder is added by using a special tool via the through hole 2a' onto the solder ball 3a as indicated by an arrow, so that the solder ball 3a can be in touch with the motherboard 4. Thus, the solder ball 3a can be repaired without separating and detaching the interposer substrate 2 from the motherboard 4, which would decrease the manufacturing cost.

Figure 4B:
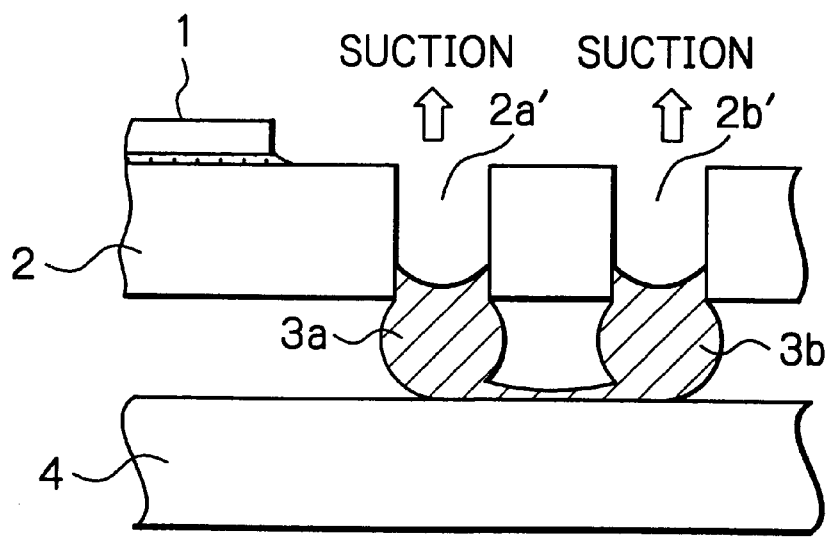

In order to repair the short-circuited solder balls 3a and 3b in FIG. 4B, the solder balls 3a and 3b are sucked by using a special tool as indicated by arrows. Then, melted solder is injected by using a special tool into the through holes 2a' and 2b', so that new solder balls can be in touch with the motherboard 4. Thus, the short-circuited solder balls 3a and 3b can be repaired without separating and detaching the interposer substrate 2 from the motherboard 4, which would decrease the manufacturing cost.

A second embodiment of the method for manufacturing a BGA type semiconductor device according to the present invention will be explained next with reference to FIGS. 5A and 5B.

Figure 5A:
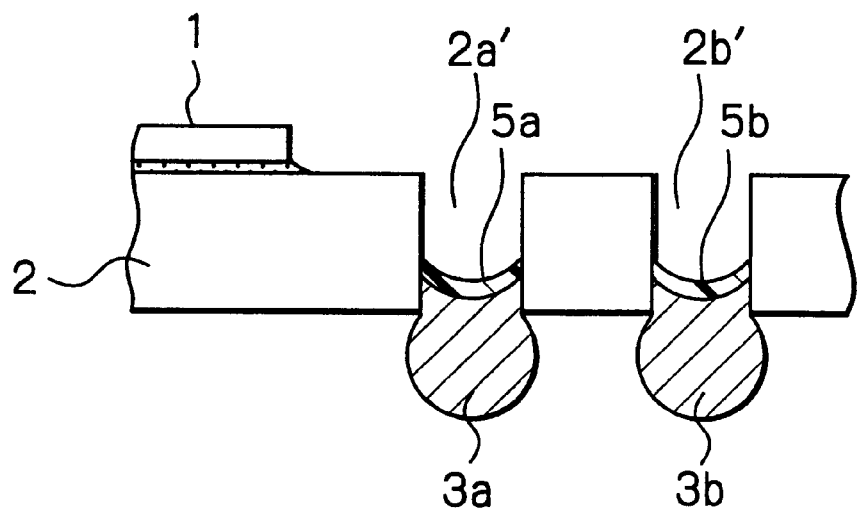
FIGS. 5A and 5B are cross-sectional views illustrating a second embodiment of the method for manufacturing a BGA type semiconductor device according to the present invention.

First, referring to FIG. 5A, resin layers 5a and 5b are formed in advance within through holes 2a' and 2b' of an interposer substrate 2. Then, a semiconductor chip 1 is mounted on a first surface of the interposer substrate 2. In this case, the semiconductor chip 1 can be of a flip-chip type. On the other hand, solder balls 3a and 3b are provided on a second surface of the interposer substrate 2. The semiconductor chip 1 is electrically connected via through holes 2a' and 2b' having a relatively large diameter such as 0.5 mm provided in the interposer substrate 2 to the solder balls 3a and 3b, respectively. In this case, the solder balls 3a and 3b are provided so as to clog the through holes 2a' and 2b', respectively. Also, metal layers (not shown) are formed within the through holes 2a' and 2b'.

Figure 5B:
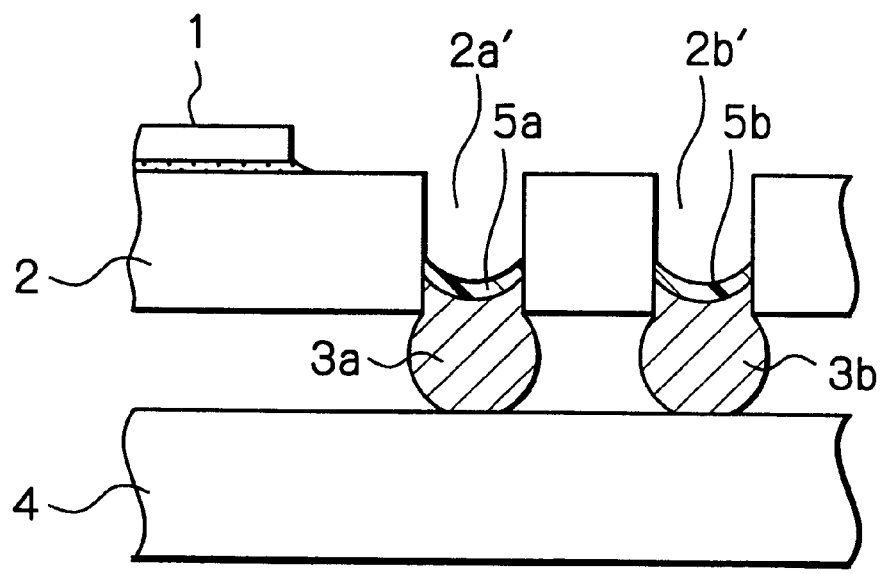

Next, referring to FIG. 5B, the BGA semiconductor device of FIG. 4A is mounted on a motherboard 4 by soldering the solder balls 3a and 3b thereto.

The resin layers 5a and 5b serve as means for supporting the solder balls 3a and 3b. Therefore, if the BGA semiconductor device of FIG. 5A is relatively heavy, the solder balls 3a and 3b cannot penetrate the through holes 2a' and 2b', respectively, due to the presence of the resin layers 5a and 5b.

Even in the method as illustrated in FIGS. 5A and 5B, an open state or a short-circuit state may be generated due to the defective soldering process in the same way as in the first embodiment.

In order to repair the solder ball 3a and/or 3b in FIG. 5B, the resin film 5a and/or 5b is first removed by a mechanical or chemical process. Then, the solder ball 3a and/or 3b can be repaired in the same way as in the first embodiment. Thus, the solder ball 3a and/or 3b can be repaired without separating and detaching the interposer substrate 2 from the motherboard 4, which would decrease the manufacturing cost.

As explained hereinabove, according to the present invention, since defective solder balls can be repaired without separating and detaching an interposer substrate from a motherboard, the manufacturing cost can be decreased. Note that BGA semiconductor devices including such defective solder balls can be reused.

What is claimed is:

1. A ball grid array type semiconductor device, comprising:

a substrate having first and second surfaces, a plurality of through holes being formed within said substrate;

a semiconductor chip mounted on the first surface of said substrate;

solder balls formed on the second surface of said substrate, one of said solder balls clogging one of said through holes; and a plurality of resin layers for supporting said solder balls, wherein one of said resin layers is formed within the one of said through holes, and the one of said through holes is open at an end of the one of said through holes, wherein the end of one of said through holes is at the first surface of said substrate.

2. The ball grid array type semiconductor of claim 1 wherein a second of said resin layers is formed within a second of said through holes and the second of said through holes is open at an end of the second of said through holes, wherein the end of the second of said through holes is at the first surface of said substrate.

* * * * *

UNITED STATES PATENT AND TRADEMARK OFFICE
CERTIFICATE OF CORRECTION

PATENT NO.    : 6,642,624 B2
DATED         : November 4, 2003
INVENTOR(S)   : Hiroshi Sakai It is certified that error appears in the above-identified patent and that said Letters Patent is hereby corrected as shown below:

Title page,
Item [54], Title, please change from "BALL GRID ARRAY TYPE SEMICONDUCTOR DEVICE" to -- BALL GRID ARRAY TYPE SEMICONDUCTOR DEVICE AND METHOD FOR MANUFACTURING THE SAME --.

Signed and Sealed this

Nineteenth Day of July, 2005

JON W. DUDAS
*Director of the United States Patent and Trademark Office*